(12) United States Patent
Wieting

(10) Patent No.: US 8,383,450 B2
(45) Date of Patent: Feb. 26, 2013

(54) LARGE SCALE CHEMICAL BATH SYSTEM AND METHOD FOR CADMIUM SULFIDE PROCESSING OF THIN FILM PHOTOVOLTAIC MATERIALS

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 12/569,490

(22) Filed: Sep. 29, 2009

(65) Prior Publication Data

US 2010/0087027 A1    Apr. 8, 2010

Related U.S. Application Data

(60) Provisional application No. 61/101,657, filed on Sep. 30, 2008.

(51) Int. Cl.
*H01L 21/84*    (2006.01)

(52) U.S. Cl. .............. 438/86; 438/95; 136/230

(58) Field of Classification Search .............. 438/85–86, 438/98, 95, 104; 136/260
See application file for complete search history.

(56) References Cited

U.S. PATENT DOCUMENTS

| | | | |
|---|---|---|---|
| 3,520,732 A | 7/1970 | Nakayama et al. | |
| 3,828,722 A | 8/1974 | Reuter et al. | |
| 3,975,211 A | 8/1976 | Shirland | |
| 4,062,038 A | 12/1977 | Cuomo et al. | |
| 4,095,006 A * | 6/1978 | Jordan et al. | 427/427 |
| 4,204,933 A | 5/1980 | Barlow et al. | |
| 4,263,336 A | 4/1981 | Thompson et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |

(Continued)

FOREIGN PATENT DOCUMENTS

| | | |
|---|---|---|
| AU | 1998/78651 | 2/1999 |
| DE | 3314197 A1 | 11/1983 |

(Continued)

OTHER PUBLICATIONS

"Spectroscopic Characterization of Chemical Bath Deposited Cadmium Sulphide Layers", (Grecu et al.), Journal of Optoelectronics and Advanced Materials vol. 6, No. 1, Mar. 2004, p. 127-132.

(Continued)

*Primary Examiner* — Thanhha Pham
(74) *Attorney, Agent, or Firm* — Kilpatrick Townsend & Stockton LLP

(57) ABSTRACT

A method for forming a thin film photovoltaic material. The method includes providing a plurality of substrates. Each of the substrates has a surface region, an overlying first electrode material, an absorber material including at least a copper species, an indium species, and a selenium species. The method immerses the plurality of substrates in an aqueous solution including an ammonia species, a cadmium species, and a organosulfur (for example, thiourea) species in a bath to form a cadmium sulfide window material having a thickness of less than about 200 Angstroms overlying the absorber material. The aqueous solution is maintained at a temperature ranging from about 50 to about 60 Degrees Celsius. The plurality of substrates having at least the absorber material and the window layer are removed from the aqueous solution. The aqueous solution is further subjected to a filter process to substantially remove one or more particles greater than about 5 microns.

16 Claims, 3 Drawing Sheets

U.S. PATENT DOCUMENTS

| | | | |
|---|---|---|---|
| 4,471,155 A | 9/1984 | Mohr et al. | |
| 4,499,658 A | 2/1985 | Lewis | |
| 4,507,181 A | 3/1985 | Nath et al. | |
| 4,517,403 A | 5/1985 | Morel et al. | |
| 4,518,855 A | 5/1985 | Malak | |
| 4,542,255 A | 9/1985 | Tanner et al. | |
| 4,581,108 A | 4/1986 | Kapur et al. | |
| 4,589,194 A | 5/1986 | Roy | |
| 4,598,306 A | 7/1986 | Nath et al. | |
| 4,599,154 A | 7/1986 | Bender et al. | |
| 4,611,091 A | 9/1986 | Choudary et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,705,912 A | 11/1987 | Nakashima et al. | |
| 4,724,011 A | 2/1988 | Turner et al. | |
| 4,727,047 A | 2/1988 | Bozler et al. | |
| 4,751,149 A | 6/1988 | Vijayakumar et al. | |
| 4,775,425 A | 10/1988 | Guha et al. | |
| 4,793,283 A | 12/1988 | Sarkozy | |
| 4,798,660 A | 1/1989 | Ermer et al. | |
| 4,816,082 A | 3/1989 | Guha et al. | |
| 4,816,420 A | 3/1989 | Bozler et al. | |
| 4,865,999 A | 9/1989 | Xi et al. | |
| 4,873,118 A | 10/1989 | Elias et al. | |
| 4,915,745 A | 4/1990 | Pollock et al. | |
| 4,950,615 A | 8/1990 | Basol et al. | |
| 4,968,354 A | 11/1990 | Nishiura et al. | |
| 4,996,108 A | 2/1991 | Divigalpitiya et al. | |
| 5,008,062 A | 4/1991 | Anderson et al. | |
| 5,011,565 A | 4/1991 | Dube et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,069,727 A | 12/1991 | Kouzuma et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,154,777 A | 10/1992 | Blackmon et al. | |
| 5,180,686 A | 1/1993 | Banerjee et al. | |
| 5,211,824 A | 5/1993 | Knapp | |
| 5,217,564 A | 6/1993 | Bozler et al. | |
| 5,231,047 A | 7/1993 | Ovshinsky et al. | |
| 5,248,345 A | 9/1993 | Sichanugrist et al. | |
| 5,259,883 A | 11/1993 | Yamabe et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,397,401 A | 3/1995 | Toma et al. | |
| 5,399,504 A | 3/1995 | Ohsawa | |
| 5,436,204 A | 7/1995 | Albin et al. | |
| 5,445,847 A | 8/1995 | Wada | |
| 5,474,939 A | 12/1995 | Pollock et al. | |
| 5,501,744 A | 3/1996 | Albright et al. | |
| 5,512,107 A | 4/1996 | Curtin | |
| 5,528,397 A | 6/1996 | Zavracky et al. | |
| 5,536,333 A | 7/1996 | Foote et al. | |
| 5,578,103 A | 11/1996 | Araujo et al. | |
| 5,578,503 A | 11/1996 | Karg et al. | |
| 5,622,634 A | 4/1997 | Noma et al. | |
| 5,626,688 A | 5/1997 | Probst et al. | |
| 5,665,175 A | 9/1997 | Safir | |
| 5,676,766 A | 10/1997 | Probst et al. | |
| 5,726,065 A | 3/1998 | Szlufcik et al. | |
| 5,738,731 A | 4/1998 | Shindo et al. | |
| 5,858,819 A | 1/1999 | Miyasaka | |
| 5,868,869 A | 2/1999 | Albright et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,107,562 A | 8/2000 | Hashimoto et al. | |
| 6,127,202 A | 10/2000 | Kapur et al. | |
| 6,160,215 A | 12/2000 | Curtin | |
| 6,166,319 A | 12/2000 | Matsuyama | |
| 6,169,246 B1 * | 1/2001 | Wu et al. | 136/265 |
| 6,172,297 B1 | 1/2001 | Hezel et al. | |
| 6,258,620 B1 | 7/2001 | Morel et al. | |
| 6,294,274 B1 | 9/2001 | Kawazoe et al. | |
| 6,307,148 B1 | 10/2001 | Takeuchi et al. | |
| 6,323,417 B1 | 11/2001 | Gillespie et al. | |
| 6,328,871 B1 | 12/2001 | Ding et al. | |
| 6,361,718 B1 | 3/2002 | Shinmo et al. | |
| 6,372,538 B1 | 4/2002 | Wendt et al. | |
| 6,423,565 B1 | 7/2002 | Barth et al. | |
| 6,632,113 B1 | 10/2003 | Noma et al. | |
| 6,635,307 B2 | 10/2003 | Huang et al. | |
| 6,653,701 B1 | 11/2003 | Yamazaki et al. | |
| 6,667,492 B1 | 12/2003 | Kendall | |
| 6,690,041 B2 | 2/2004 | Armstrong et al. | |
| 6,692,820 B2 | 2/2004 | Forrest et al. | |
| 6,784,492 B1 | 8/2004 | Morishita | |
| 6,852,920 B2 | 2/2005 | Sager et al. | |
| 6,878,871 B2 | 4/2005 | Scher et al. | |
| 6,974,976 B2 | 12/2005 | Hollars | |
| 7,122,398 B1 | 10/2006 | Pichler | |
| 7,179,677 B2 | 2/2007 | Ramanathan et al. | |
| 7,194,197 B1 | 3/2007 | Wendt et al. | |
| 7,220,321 B2 | 5/2007 | Barth et al. | |
| 7,235,736 B1 | 6/2007 | Buller et al. | |
| 7,252,923 B2 | 8/2007 | Kobayashi | |
| 7,265,037 B2 | 9/2007 | Yang et al. | |
| 7,319,190 B2 | 1/2008 | Tuttle | |
| 7,364,808 B2 | 4/2008 | Sato et al. | |
| 7,442,413 B2 | 10/2008 | Zwaap et al. | |
| 7,544,884 B2 | 6/2009 | Hollars | |
| 7,736,755 B2 | 6/2010 | Igarashi et al. | |
| 7,741,560 B2 | 6/2010 | Yonezawa | |
| 7,855,089 B2 | 12/2010 | Farris, III et al. | |
| 7,863,074 B2 | 1/2011 | Wieting | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |
| 8,017,860 B2 | 9/2011 | Lee | |
| 8,142,521 B2 | 3/2012 | Wieting | |
| 8,168,463 B2 | 5/2012 | Wieting | |
| 8,178,370 B2 | 5/2012 | Lee et al. | |
| 8,183,066 B2 | 5/2012 | Lee et al. | |
| 8,217,261 B2 | 7/2012 | Wieting | |
| 2002/0002992 A1 | 1/2002 | Kariya et al. | |
| 2002/0004302 A1 | 1/2002 | Fukumoto et al. | |
| 2002/0061361 A1 | 5/2002 | Nakahara et al. | |
| 2002/0063065 A1 | 5/2002 | Sonoda et al. | |
| 2003/0075717 A1 | 4/2003 | Kondo et al. | |
| 2003/0089899 A1 | 5/2003 | Lieber et al. | |
| 2003/0188777 A1 | 10/2003 | Gaudiana et al. | |
| 2003/0230338 A1 | 12/2003 | Menezes | |
| 2004/0063320 A1 | 4/2004 | Hollars | |
| 2004/0084080 A1 | 5/2004 | Sager et al. | |
| 2004/0095658 A1 | 5/2004 | Buretea et al. | |
| 2004/0110393 A1 | 6/2004 | Munzer et al. | |
| 2004/0187917 A1 | 9/2004 | Pichler | |
| 2004/0245912 A1 | 12/2004 | Thurk et al. | |
| 2004/0252488 A1 | 12/2004 | Thurk | |
| 2004/0256001 A1 | 12/2004 | Mitra et al. | |
| 2005/0074915 A1 | 4/2005 | Tuttle et al. | |
| 2005/0098205 A1 | 5/2005 | Roscheisen et al. | |
| 2005/0109392 A1 | 5/2005 | Hollars | |
| 2005/0164432 A1 | 7/2005 | Lieber et al. | |
| 2005/0194036 A1 | 9/2005 | Basol | |
| 2005/0287717 A1 | 12/2005 | Heald et al. | |
| 2006/0034065 A1 | 2/2006 | Thurk | |
| 2006/0040103 A1 | 2/2006 | Whiteford et al. | |
| 2006/0051505 A1 | 3/2006 | Kortshagen et al. | |

| | | |
|---|---|---|
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0243657 A1 | 10/2007 | Basol et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Milshtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0115827 A1 | 5/2008 | Woods et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |

FOREIGN PATENT DOCUMENTS

| | | |
|---|---|---|
| DE | 2001/40599 A1 | 8/2001 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005-311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

International Search Report and Written Opinion of PCT Application No. PCT/US09/59100, date of mailing Dec. 4, 2009, 8 pages total.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "$CuInS_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Application", Materials Research Society, Proceedings vol. 668, (2001) ppH3.5.1—H3.5.6

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1—H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in $n$-$TiO_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

* cited by examiner

LARGE SCALE CHEMICAL BATH SYSTEM AND METHOD FOR CADMIUM SULFIDE PROCESSING OF THIN FILM PHOTOVOLTAIC MATERIALS

CROSS-REFERENCES TO RELATED APPLICATIONS

This application claims priority to U.S. Provisional Patent Application No. 61/101,657, filed Sep. 30, 2008, entitled "LARGE SCALE CHEMICAL BATH SYSTEM AND METHOD FOR CADMIUM SULFIDE PROCESSING OF THIN FILM PHOTOVOLTAIC MATERIALS" by inventor Robert D. Wieting, commonly assigned and incorporated by reference herein for all purposes.

BACKGROUND OF THE INVENTION

The present invention relates generally to photovoltaic materials and manufacturing method. More particularly, the present invention provides a method and structure for fabricating thin film solar cells. Merely by way of example, the present method and structure include a thin film window layer for manufacture of copper indium gallium diselenide based thin film photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

BRIEF SUMMARY OF THE INVENTION

Embodiments according to the present invention relate to photovoltaic materials and manufacturing method. More particularly, the present invention provides a method and structure for fabricating thin film solar cells. Merely by way of example, the present method and structure include a thin film window layer for manufacture of copper indium gallium diselenide based thin film photovoltaic devices, but it would be recognized that the invention may have other configurations.

In a specific embodiment, a method for forming a thin film photovoltaic material is provided. The method includes providing a plurality of substrates, each of the substrates having a surface region, an overlying first electrode material, and an absorber material including at least a copper species, an indium species, and a selenium species. The method includes immersing the plurality of substrates in an aqueous solution. The aqueous solution includes an ammonia species, a cadmium species, and an organosulfur species such as thiourea in a specific embodiment. The aqueous solution is maintained at a temperature ranging from about 50 Degrees Celsius to about 60 Degrees Celsius during at least the immersing of the plurality of substrates according to a specific embodiment. In a preferred embodiment, the absorber material is a p-type photovoltaic material. The method forms a window material including at least a cadmium sulfide film material, which has an n-type semiconductor characteristic, during at least the immersing of the plurality of substrates to a thickness of about 200 Angstroms and less or others. The plurality of substrates having at least the absorber material and the window layer are removed from the aqueous solution and further to a cleaning solution.

Many benefits can be achieved by ways of the present invention over conventional techniques. For example, embodiments according to the present provide an easy to implement method for the deposition of a cadmium sulfide window layer for a cadmium indium selenide (CIS) or cadmium indium gallium selenide (CIGS) thin film photovoltaic cell. Additionally, the present method provides a cost effective way to fabricate photovoltaic cells. Depending on the embodiment, one or more of the benefits may be achieved. One skilled in the art would recognize other variations, modifications, and alternatives.

These and other benefits will be described in more detail throughout the present specification and particularly below. Merely by way of example, the present method and materials include absorber materials made of CIGS, CIS, or others for single junction cells or multi junction cells.

DETAILED DESCRIPTION OF THE INVENTION

Embodiments according to the present invention relate to photovoltaic materials and for manufacturing method. More particularly, the present invention provides a method and structure for fabricating thin film solar cells. Merely by way of example, the present method and structure include a thin film window layer for manufacture of copper indium gallium diselenide based thin film photovoltaic devices, but it would be recognized that the invention may have other configurations.

Figure 1:
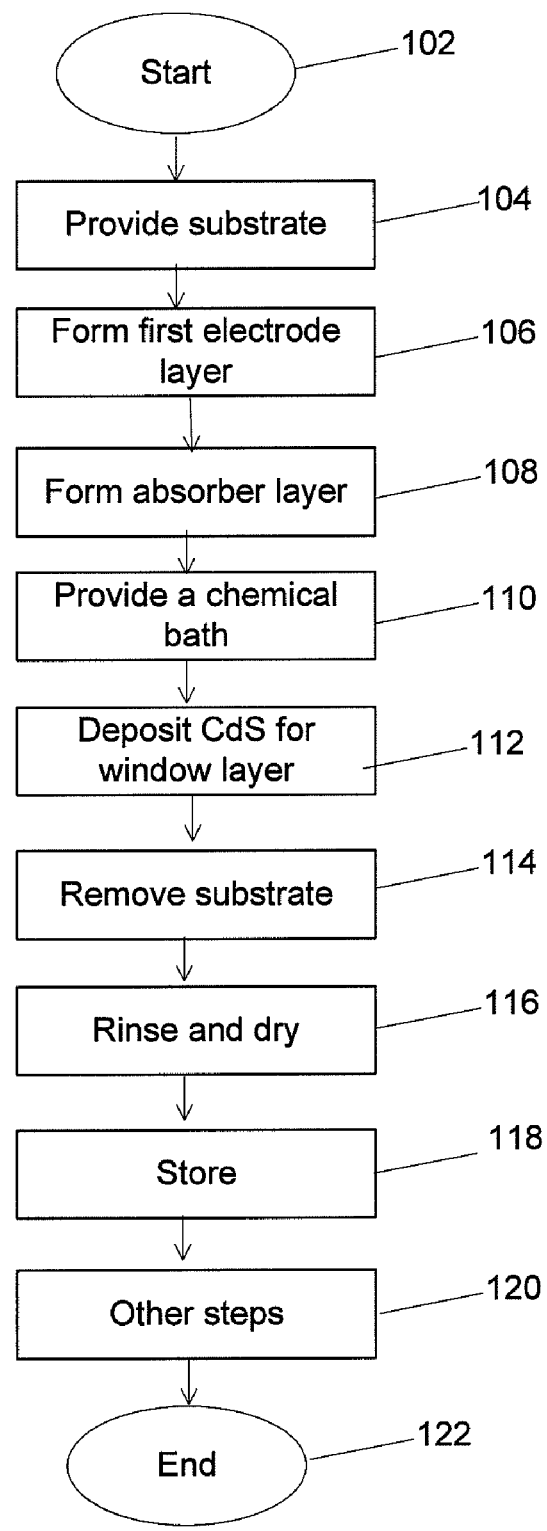
FIG. 1 is a simplified process flow diagram illustrating a method for fabricating a photovoltaic cell according to an embodiment of the present invention.

FIG. 1 is a simplified process flow diagram for a method of fabricating a photovoltaic cell according to an embodiment of the present invention. As shown in FIG. 1, the method begins with a start step (Step 102). The method includes providing a plurality of substrates (Step 104). Each of the plurality of substrates includes a transparent substrate material. The method includes forming a first electrode layer overlying a surface region of the substrate (Step 106). The method forms an absorber layer comprising at least a CIS or a CIGS material (Step 108). The method includes providing a bath system for deposition of a cadmium sulfide (CdS) film (Step 110) and submerges the plurality of substrates into the bath system. The bath system includes precursor species to the formation (Step 112) of the cadmium sulfide thin film material overlying at least a surface region of the absorber layer. In a specific embodiment the cadmium sulfide thin film material allows for a window layer for the thin film photovoltaic cell. The precursor species include at least a cadmium ion species, a sulfur species, and a catalytic species. The method removes the plurality of substrates from the bath system (Step 114) and subjects the cadmium sulfide film to one or more rinsing and drying process (Step 116). The method then stores the plurality of substrates in a desiccated environment (Step 118). Other steps are performed (Step 120) to complete the photovoltaic cell. These other steps can include formation of a second contact element, and a lamination process to form a solar module, among others. The method ends with an end step (Step 122).

The above sequence of steps provide a method of fabricating a photovoltaic cell according to an embodiment of the present invention. In a specific embodiment, the present method provides a way of forming a cadmium sulfide window layer for a thin film photovoltaic cell made of GIGS, CIS, or others.

Figure 2:
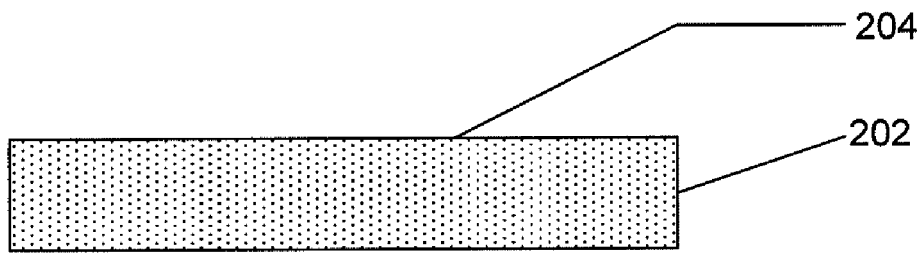
FIG. 2-5 are simplified diagrams illustrating a method for fabricating a photovoltaic cell according to an embodiment of the present invention.

FIGS. 2-5 are simplified diagrams illustrating a method of fabricating a thin film photovoltaic cell according to an embodiment of the present invention. As shown in FIG. 2, a transparent substrate 202 including a surface region 204 is provided. The transparent substrate can be made of soda lime glass in a specific embodiment. Other suitable transparent substrates such as quartz, fused silica, solar glass can also be used. Each of the transparent substrate can include a barrier layer deposited on a surface region. The barrier layer prevents sodium ions from the glass material to diffuse into photovoltaic material area in a specific embodiment. The barrier layer can be a dielectric material such as silicon oxide deposited using technique such as a sputtering process, a chemical vapor deposition process, including plasma enhanced processes, and others. Other barrier materials may also be used. These barrier materials include aluminum oxide, titanium nitride, silicon nitride, tantalum oxide, zirconium oxide depending on the embodiment.

Figure 3:
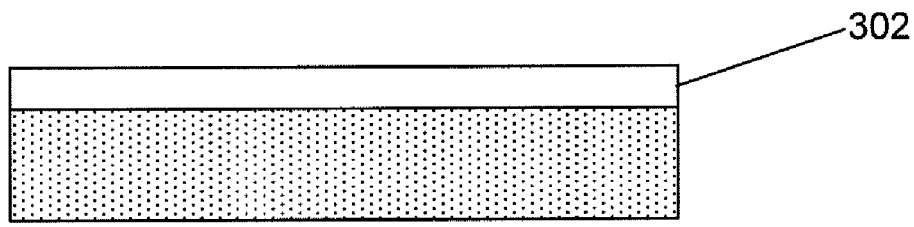

Referring to FIG. 3, the method includes forming a first electrode layer 302 overlying the surface region of the transparent substrate, which has a barrier layer formed thereon. The first electrode layer may be provided using a transparent conductor oxide (TCO) such as indium tin oxide (commonly called ITO), fluorine doped tin oxide, and the like. In certain embodiments, the first electrode layer may be provided using a metal material. The metal material may be molybdenum in a specific embodiment. The first electrode layer can be formed using deposition techniques such as sputtering, plating, physical vapor deposition (including evaporation, sublimation), chemical vapor deposition (including plasma enhanced processes) following by a patterning process.

Figure 4:
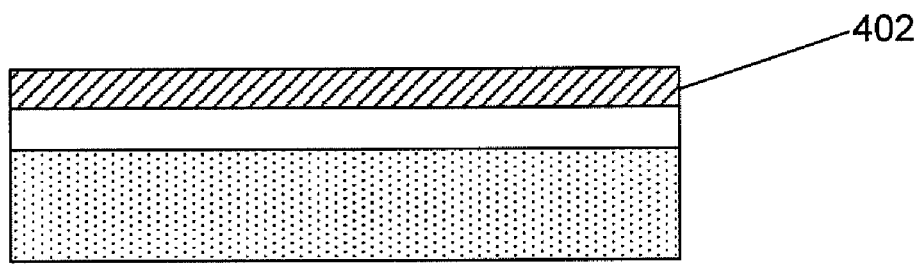

As shown in FIG. 4, the method includes providing an absorber layer 402 overlying the first electrode layer. The absorber layer can be a thin film semiconductor material in a specific embodiment. In a specific embodiment, the thin film semiconductor material is a p-type semiconductor material provided by a copper indium diselenide material, or a copper indium gallium diselenide material, other combinations, and the like. In other embodiments, the absorber material can be made of a copper indium disulfide material or a copper indium gallium disulfide material, or a any combination of these, or others, depending on the application. Typically, the p-type characteristics may be provided using dopants such as boron, gallium, aluminum species according to a specific embodiment. The absorber layer may be deposited by techniques such as sputtering, plating, evaporation including a sulfurization or selenization step. In a specific embodiment, details of the formation of the absorber material made of copper indium disulfide may be found in U.S. Patent Application No. 61/059,253, titled "High Efficiency Photovoltaic Cell and Manufacturing Method," commonly assigned, and hereby incorporated by reference. Of course, there can be other variations, modifications, and alternatives.

Figure 5:
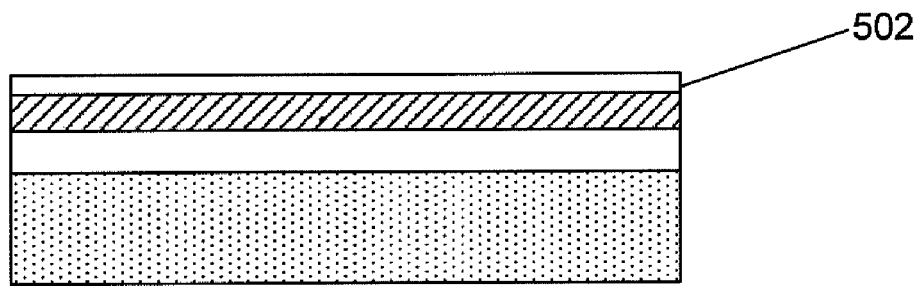
Figure 6:
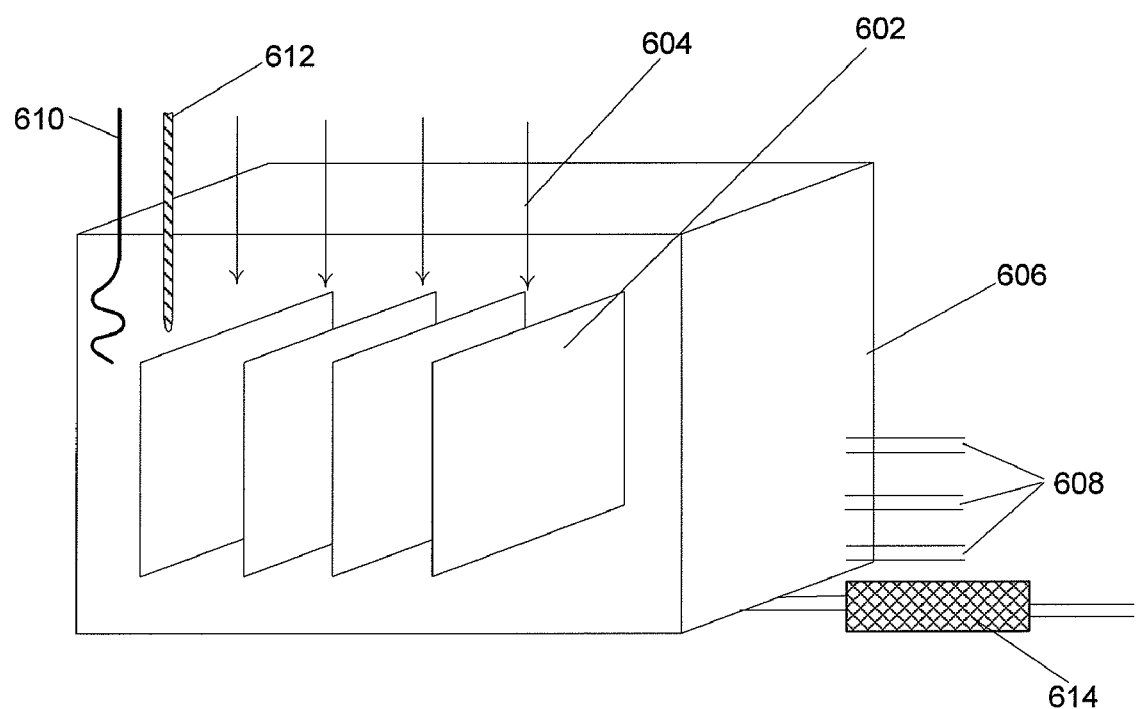
FIG. 6 is a simplified diagram illustrating a chemical bath system for depositing a window layer for the photovoltaic cell according to an embodiment of the present invention.

In a specific embodiment, the method includes forming a window layer 502 overlying the absorber layer as shown in FIG. 5. The window layer is often provided using a wide bandgap n type semiconductor material for a p-type absorber layer. In a specific embodiment, the window layer uses material selected from: cadmium sulfide (CdS), zinc sulfide (ZnS), zinc selenide (ZnSe), zinc oxide (ZnO), zinc magnesium oxide (ZnMgO), or the like. As illustrated in FIG. 6, the window layer can be provided using a chemical bath deposition process in a specific embodiment. The chemical bath deposition process is usually a batch process. As shown, a plurality of substrates 602 having a first electrode layer, an absorber layer, deposited on a transparent substrate are provided. The plurality of substrates are usually provided in a holder or a tray device (not shown). The plurality substrates are allowed to immerse 604 into a chemical bath 606. The chemical bath contains at least various chemical species as described throughout this application for the window layer. In certain application, a catalyst is also included. The chemical bath is characterized by a length, a width, and a height. As shown, the chemical bath system further includes one or more manifolds 608 to allow the various chemical species to be added to the chemical bath, independently or concurrently. In certain embodiment, the chemical bath system can include one or more heating devices 610 and/or temperature monitoring devices 612 to provide reaction at a temperature higher than room temperature. The heating device may be provided using an immersion heater in some embodiments. In a specific embodiment, the heater is coated with a suitable material and provides thermal energy to the chemical bath. In a specific embodiment, the heater also has safety and/or alarm devices to stop the thermal process and the like. Of course, there can be other variations, modifications, and alternatives.

In a specific embodiment, the chemical bath is provided in an enclosure with suitable dimensions and materials. In a specific embodiment, the enclosure for the chemical bath is characterized by a width, a length, a height and an internal volume. For example, the chemical bath can have an internal volume of about 250 gallons to about 1000 gallons in certain embodiments, but can be others. In a specific embodiment, the enclosure can be made of a suitable plastic material and/or fiberglass and/or solid material, which has a suitable chemical resistant coating. In a specific embodiment, the bath is subjected to flow from one or more pumping devices, which are coupled to the bath and enclosure. In a specific embodiment, the flow provides for a constantly stirred reactor configuration.

In a specific embodiment, the window layer is provided using a cadmium sulfide material. Depending on the embodiment, the chemical bath system can be provided with a aqueous solution, which includes at least a cadmium species, an ammonia species, and an organosulfur species. In a specific embodiment, the cadmium species can be derived from various cadmium salts such as cadmium acetate, cadmium iodide, cadmium sulfate, cadmium nitrate, cadmium chloride, cadmium bromide, and others. In a specific embodiment, the organosulfur species can be provided using compounds as thiourea, but can be others. These other organosulfur compound may include NN dimethy thiourea and other suitable chemistries, and combinations.

In a specific embodiment, hot water is first provided in the chemical bath system. The hot water can have a temperature ranging from about 50 degrees Celsius to about 60 degrees Celsius in a specific embodiment. An ammonia solution having a concentration of about 28 weight percent is added to the hot water to provide for a final ammonia concentration of about 0.5 M or a pH of about 11 to 12 in the aqueous solution in a specific embodiment. The cadmium species is allowed to first dissolved to form a cadmium solution in a specific embodiment and introduce into the chemical bath containing the ammonia species. In a specific embodiment, the organosulfur species, for example, thiourea, is provided in a third aqueous solution before added to the chemical bath. In a specific embodiment, the thiourea species is provided at a concentration two times to three times a concentration of the cadmium species in the aqueous solution. That is, the cadmium species is a limiting species in a specific embodiment. In certain embodiments, the cadmium species can have a concentration of about 0.1 millimolar to about 1.0 millimolar in the aqueous solution to provide for a high quality cadmium sulfide widow material having a thickness of about 250 Angstroms or less.

Referring again to FIG. 6, in a specific embodiment, the chemical bath system includes one or more filter elements 614 and associated devices. The one or more filter element can have a nominal pore size of about 5 microns to remove a cadmium sulfide colloid species formed in the chemical bath. The associated devices can include a pump and others to circulate the aqueous solution through the one or more filter element and back into the chemical bath after removing the cadmium sulfide colloid species. The one or more filter elements can be arranged parallel or in series or a combination depending on the embodiment. In a specific embodiment, the filters are configured within a filter housing, which is chemical resistant and subjected to pressure from the pump. In a preferred embodiment, the filters are typically replaced with a pressure drop and/or increase of predetermined amount occurs or other suitable frequencies.

In certain embodiments, an optimum amount of an indium species is allow to impregnate the cadmium sulfide film to enhance or change certain physical properties of the cadmium sulfide film. For example, an indium impregnated cadmium sulfide film has a greater conductivity and may also include hardness greater than that of a cadmium sulfide film. Certain indium impregnated cadmium sulfide film may exhibit greater adherence to a tin oxide film or other transparent electrode material, such as zinc oxide, which is usually used as a buffer layer between the window layer and a contact layer. Depending upon the embodiment, details on the aluminum impregnated cadmium sulfide film may be found in U.S. Pat. No. 4,086,101, in the names of Jordan et al., and incorporated by reference hereby.

In a specific embodiment, after forming the window layer, the method includes removing the plurality of photovoltaic cells from the chemical bath system and subjects the window layer to one or more rinsing process. In a specific embodiment, the rinsing process uses deionized water to remove any residual chemical from the window layer film and from the back side region of each of the plurality of photovoltaic cells. In certain embodiment, the cadmium sulfide material may occur in a powder form on the backside region and can be removed using the rinsing process or can be removed mechanically, for example scraping. The rinsing process may include one or more rinses using deionized water. The plurality of photovoltaic cells are then dried after the rinsing process.

In a specific embodiment, after drying, the plurality of photovoltaic cells are stored in a desiccated environment before further processing. The desiccated environment prevents exposure of the plurality of photovoltaic cells to moisture and other contaminations that may affect the performance of the photovoltaic cell. In a specific embodiment, the environment has a relative humidity of less than about 50% or less than about 10%. The temperature can be about room temperature or slightly lower or higher according to a specific embodiment. Of course there can be other modifications, variations, and alternatives. Further details of specific process recipes can be found throughout the present specification and more particularly below.

EXPERIMENTAL

To prove the principle and operation of the present invention, we have prepared various examples. Example 6 below provides a recipe for a chemical bath used for producing a window layer in photovoltaics. This example has been included along with several comparative examples as cited in U.S. Pat. No. 4,095,006 to Jordan et al. These examples are merely illustrations, which should not unduly limit the scope of the claims herein. One of ordinary skill in the art would recognize other variations, modifications, and alternatives. In these examples, concentrated versions of cadmium and dilute versions, which are preferred according to embodiments of the present invention, are utilized. The dilute version provides an advantage of a high quality CdS layer, which is fairly thin and is used with a high quality ZnO layer, preferably using a MOCVD process or the like. The term "thin" ranges from about 300 Angstroms and less and preferably about 250 Angstroms and less, but can be other thicknesses. Of course, there can be other variations, modifications, and alternatives.

Comparative Example 1

A solution comprising:
22.08 gm—Cadmium Acetate [$Cd(CH_3COO)_2.2H_2O$]
6.58 gm—Thiourea 8.24 gm—Ammonium Chloride [$NH_4Cl$]
6.01—Water
will form a uniform, continuous cadmium sulfide film. However, a solution having the same constituents in the same proportions, but without ammonium chloride, will not form such a film.

Comparative Example 1-A 16.30 gm—Cadmium Acetate [$Cd(CH_3COO)_2 \cdot 2H_2O$]
6.58 gm—Thiourea
8.24 gm—Ammonium chloride [$NH_4Cl$]
6.58 gm—Aluminum chloride [$AlCl_3 \cdot 6H_2O$]
6.01—Water
This solution is essentially the same as the Example 1 solution, with the addition of aluminum chloride. The aluminum chloride is added to alter the physical properties of the cadmium sulfide film, in the manner and for the reasons disclosed in U.S. application Ser. No. 631,815. (U.S. Pat. No. 4,086,101)

Comparative Example 1-B 29.45 gm—Cadmium Acetate [$Cd(CH_3COO)_2 \cdot 2H_2O$]
6.94 gm—Thiourea
14.0 ml HCl (concentrated)
6.01—Water
This solution, which is also essentially identical to the Example 1 solution, utilizes hydrochloric acid as the catalyzing chlorine containing compound, instead of ammonium chloride.

Comparative Example 2

30.36 gm—Cadmium Iodide [$CdI_2$]
6.58 gm—Thiourea
14.0 ml HCl (concentrated)
6.01—Water Comparative Example 2-A 30.36 gm—Cadmium Iodide [$CdI_2$]
6.58 gm—Thiourea
8.24 gm—Ammonium Chloride [$NH_4Cl$]
6.01—Water Comparative Example 3

21.2 gm—Cadmium Sulfate [$3CdSO_4 \cdot 8H_2O$]
6.58 gm—Thiourea
14.0 ml—HCl (concentrated)
6.01—Water Comparative Example 3-A 21.2 gm—Cadmium Sulfate [$3CdSO_4 \cdot 8H_2O$]
6.58 gm—Thiourea
8.24 gm—Ammonium Chloride [$NH_4Cl$]
6.01—Water Comparative Example 4

25.57 gm—Cadmium Nitrate [$Cd(NO_3)_2 \cdot 4H_2O$]
6.58 gm—Thiourea
14.0 ml—HCl (concentrated)
6.01—Water Comparative Example 5

37.24 gm—Cadmium Bromide [$CdBr_2 \cdot 4H_2O$]
10.96 gm—Thiourea
14.0 ml—HCl (concentrated)
6.01—Water Example 6

Hot water bath with:
Aqueous ammonia (derived from a highest concentration of 28 weight percent)-0.5 molar
Cadmium ion ($Cd^{2+}$)+ about 0.1 millimolar to about 1 millimolar
Thiourea-concentration at 3× to 2× of cadmium ion concentration (excess thiourea)
Filter element: less than 5 microns nominal pore size
Volume: 1000 liters to about 3000 liters or greater In addition to the cadmium compounds included in the above exemplary formulae, we have found that continuous sulfide films can be fabricated according to the present invention with other cadmium compounds, including cadmium fluoride, cadmium cyanide and cadmium sulfite. Moreover, cadmium compounds which also contain chlorine, such as cadmium ammonium chloride, can be utilized in the method of the present invention to supply both cadmium and chlorine.

Although each of the exemplary solutions utilize thiourea as the sulfur containing compound, other sulfur containing compounds may be utilized. We have found thiourea, however, to be the least expensive and best suited of such compounds for purposes of solutions such as these. Similarly, hydrochloric acid and ammonium chloride are merely exemplary chlorine containing compounds, and other chlorine containing compounds may be substituted. Furthermore, although each of the above-identified exemplary solutions was developed for use in a spray process for forming a cadmium sulfide film, other well known processes for forming such films, such as dipping, vacuum deposition, or electroplating, may also be utilized. Additionally, although the above has been generally described in terms of a specific structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein. It should be understood that various changes, modifications, and variations to the solutions utilized in the method of the present invention may be effected without departing from the spirit and scope of the present invention as defined in the appended claims.

What is claimed is:
1. A method for forming a thin film photovoltaic material, the method comprising:
   providing a plurality of substrates, each of the substrates having a surface region, an overlying first electrode material, an absorber material including at least a copper species, an indium species, and a selenium species;
   providing a chemical bath comprising an aqueous solution including a cadmium species, an ammonia species, and an organosulfur species, wherein the chemical bath is maintained at a pH of between about 11 and about 12;
   immersing the plurality of substrates in the chemical bath;
   maintaining the aqueous solution at a temperature ranging from about 50 to about 60 degrees Celsius during at least the immersing of the plurality of substrates;

while the substrates are immersed, forming a window material including at least cadmium sulfide to a thickness of about 200 Angstroms and less;

removing the plurality of substrates having at least the absorber material and the window layer from the aqueous solution;

subjecting the aqueous solution to a filter process to substantially remove particles greater than about 5 microns, the particles including colloids of cadmium sulfide; and subjecting the plurality of substrates to a cleaning solution.

2. The method of claim 1 wherein the organosulfur species comprises thiourea.

3. The method of claim 2 wherein the thiourea has a concentration at least two times greater than that of the cadmium acetate in the aqueous solution.

4. The method of claim 1 wherein each of the plurality of substrates is soda lime glass.

5. The method of claim 1 wherein the filter process comprises a filter element coupled to a pump.

6. The method of claim 1 wherein the first electrode material comprises molybdenum.

7. The method of claim 1 wherein the absorber material comprises copper indium selenide.

8. The method of claim 1 wherein the ammonia species is derived from an aqueous ammonia.

9. The method of claim 8 wherein the aqueous ammonia has a concentration of about 28 weight percent.

10. The method of claim 1 wherein the cadmium species is derived from a hydrated cadmium sulfate, a hydrated cadmium chloride, or hydrated cadmium nitrate.

11. The method of claim 1 further comprising:
producing the chemical bath by the steps of:
adding aqueous ammonia to a bath of water to form an ammonia solution, the bath of water being provided at a temperature ranging from about 50 degrees Celsius to about 60 degrees Celsius; and
adding a solution of cadmium salt and a solution of thiourea to the ammonia solution.

12. The method of claim 1 wherein the cadmium species has a Cd2+ concentration ranging from about 0.1 millimolar to about 1.0 millimolar.

13. The method of claim 1 wherein the cleaning solution comprises rinse water.

14. The method of claim 1 further comprising mechanically removing any residual cadmium sulfide material on a backside of any one of the substrates.

15. The method of claim 1 wherein the bath has a volume of about 250 gallons to about 1000 gallons.

16. A method for forming a thin film photovoltaic material, the method comprising:
providing a plurality of substrates, each of the substrates having a surface region, an overlying first electrode material, an absorber material including at least a copper species, an indium species, and a selenium species;
providing a chemical bath comprising an aqueous solution including an ammonia species, a cadmium species, and thiourea, wherein the chemical bath is maintained at a pH of between about 11 and about 12;
immersing the plurality of substrates in the chemical bath;
maintaining the aqueous solution at a temperature ranging from about 50 to about 60 degrees Celsius during at least the immersing of the plurality of substrates;
while the substrates are immersed, forming a window material including at least cadmium sulfide to a thickness of about 200 Angstroms and less;
removing the plurality of substrates having at least the absorber material and the window layer from the aqueous solution;
subjecting the aqueous solution to a filter process to substantially remove one or more particles greater than about 5 microns, the one or more particles including colloids of cadmium sulfide;
subjecting the plurality of substrates to a cleaning solution;
drying the plurality of substrates; and
maintaining the plurality of substrates in a dry environment to maintain at least the absorber layer substantially free from moisture from water vapor.

* * * * *